(12) United States Patent
Kamgaing

(10) Patent No.: US 8,901,688 B2
(45) Date of Patent: Dec. 2, 2014

(54) HIGH PERFORMANCE GLASS-BASED 60 GHZ / MM-WAVE PHASED ARRAY ANTENNAS AND METHODS OF MAKING SAME

(75) Inventor: Telesphor Kamgaing, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 512 days.

(21) Appl. No.: 13/101,891

(22) Filed: May 5, 2011

(65) Prior Publication Data

US 2012/0280380 A1    Nov. 8, 2012

(51) Int. Cl.
*H01L 27/14* (2006.01)
*H01L 31/00* (2006.01)
*H01Q 21/06* (2006.01)
*H01Q 3/26* (2006.01)
*H01Q 1/12* (2006.01)
*H01Q 21/00* (2006.01)
*H01L 23/00* (2006.01)
*H01L 23/552* (2006.01)

(52) U.S. Cl.
CPC .... *H01Q 1/1271* (2013.01); *H01L 2225/06541* (2013.01); *H01L 2224/32225* (2013.01); *H01L 2224/73204* (2013.01); *H01L 2225/06537* (2013.01); *H01L 2924/1421* (2013.01); *H01Q 21/065* (2013.01); *H01L 2924/10253* (2013.01); *H01Q 3/26* (2013.01); *H01L 2224/17181* (2013.01); *H01L 2225/06517* (2013.01); *H01L 2924/1433* (2013.01); *H01L 2225/06513* (2013.01); *H01L 2224/73253* (2013.01); *H01L 2224/14181* (2013.01); *H01L 24/16* (2013.01); *H01L 2223/6677* (2013.01); *H01L 2224/16227* (2013.01); *H01L 2924/14335* (2013.01); *H01L 2924/1434* (2013.01); *H01L 2225/06565* (2013.01); *H01L 2224/32155* (2013.01); *H01L 23/552* (2013.01); *H01L 2224/13025* (2013.01); *H01Q 21/0087* (2013.01); *H01L 24/17* (2013.01); *H01L 2224/16146* (2013.01)
USPC ........... 257/428; 257/621; 257/659; 257/660; 257/686

(58) Field of Classification Search
USPC .......................................... 257/621, 659, 660
See application file for complete search history.

(56) References Cited

U.S. PATENT DOCUMENTS 6,154,176 A   11/2000 Fathy et al.
6,166,705 A   12/2000 Mast et al.

(Continued)

FOREIGN PATENT DOCUMENTS

WO   2012/151003 A2   11/2012
WO   2012/151120 A2   11/2012
WO   2012/151123 A2   11/2012
WO   2012/151123 A3   1/2013

OTHER PUBLICATIONS

International Search Report and Written Opinion Received for PCT Application No. PCT/US2012/035373, Mailed on Dec. 3, 2012, 12 pages.

(Continued)

*Primary Examiner* — Thien F Tran
(74) *Attorney, Agent, or Firm* — John N. Greaves

(57) ABSTRACT

A glass-based, high-performance 60 GHz/mm-wave antenna includes cavities disposed in a phased-array antenna (PAA) substrate. The cavities are disposed below planar antenna elements. Emitter traces are disposed on the PAA substrate opposite the planar antenna elements and the emitter traces, the cavities, and the planar antenna elements are vertically aligned.

26 Claims, 12 Drawing Sheets

(56) References Cited

U.S. PATENT DOCUMENTS

| | | | |
|---|---|---|---|
| 6,266,015 | B1 | 7/2001 | Heckaman et al. |
| 6,535,168 | B1 | 3/2003 | Marumoto et al. |
| 2005/0237267 | A1 | 10/2005 | Brown et al. |
| 2008/0001262 | A1 | 1/2008 | Kamgaing et al. |
| 2008/0029886 | A1 | 2/2008 | Cotte et al. |
| 2009/0302438 | A1 | 12/2009 | Chauhan et al. |
| 2010/0078771 | A1 | 4/2010 | Barth et al. |
| 2010/0078776 | A1 | 4/2010 | Barth et al. |
| 2010/0078779 | A1 | 4/2010 | Barth et al. |
| 2010/0127937 | A1 | 5/2010 | Chandrasekaran et al. |
| 2011/0068433 | A1 | 3/2011 | Kim et al. |
| 2012/0280366 | A1* | 11/2012 | Kamgaing et al. ............ 257/621 |
| 2012/0280860 | A1* | 11/2012 | Kamgaing et al. ............ 342/368 |

OTHER PUBLICATIONS

Office Action Received for Taiwan Patent Application No. 101112993, Mailed on Oct. 31, 2012, 2 pages of Office Action and 1 page of English Translation.

International Search Report and Written Opinion Received for PCT Application No. PCT/US2012/035421, Mailed on Nov. 12, 2012, 9 pages.

International Search Report and Written Opinion Received for PCT Application No. PCT/US2012/029363, Mailed on Oct. 29, 2012, 9 pages.

* cited by examiner

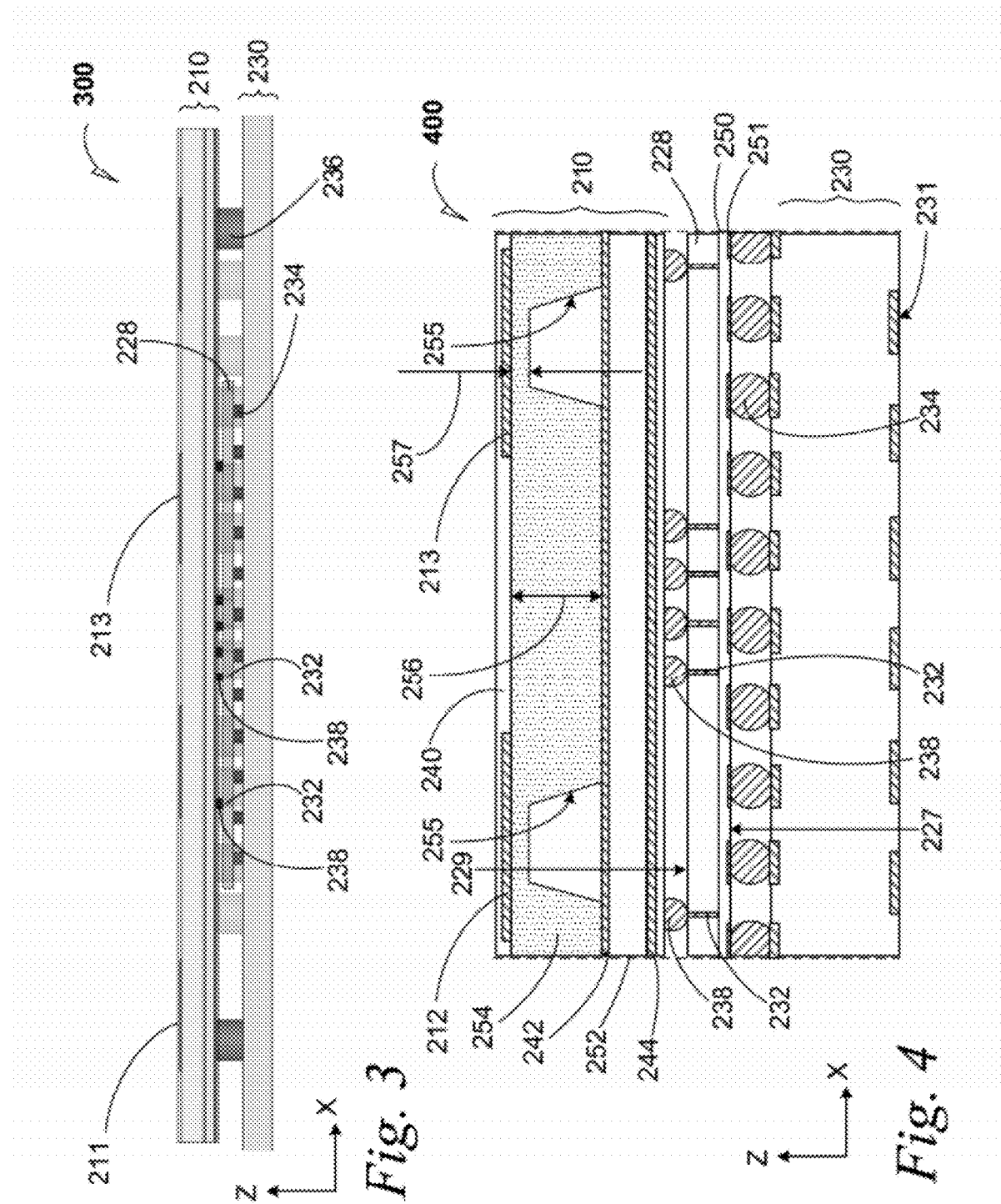

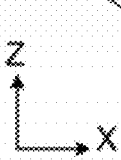

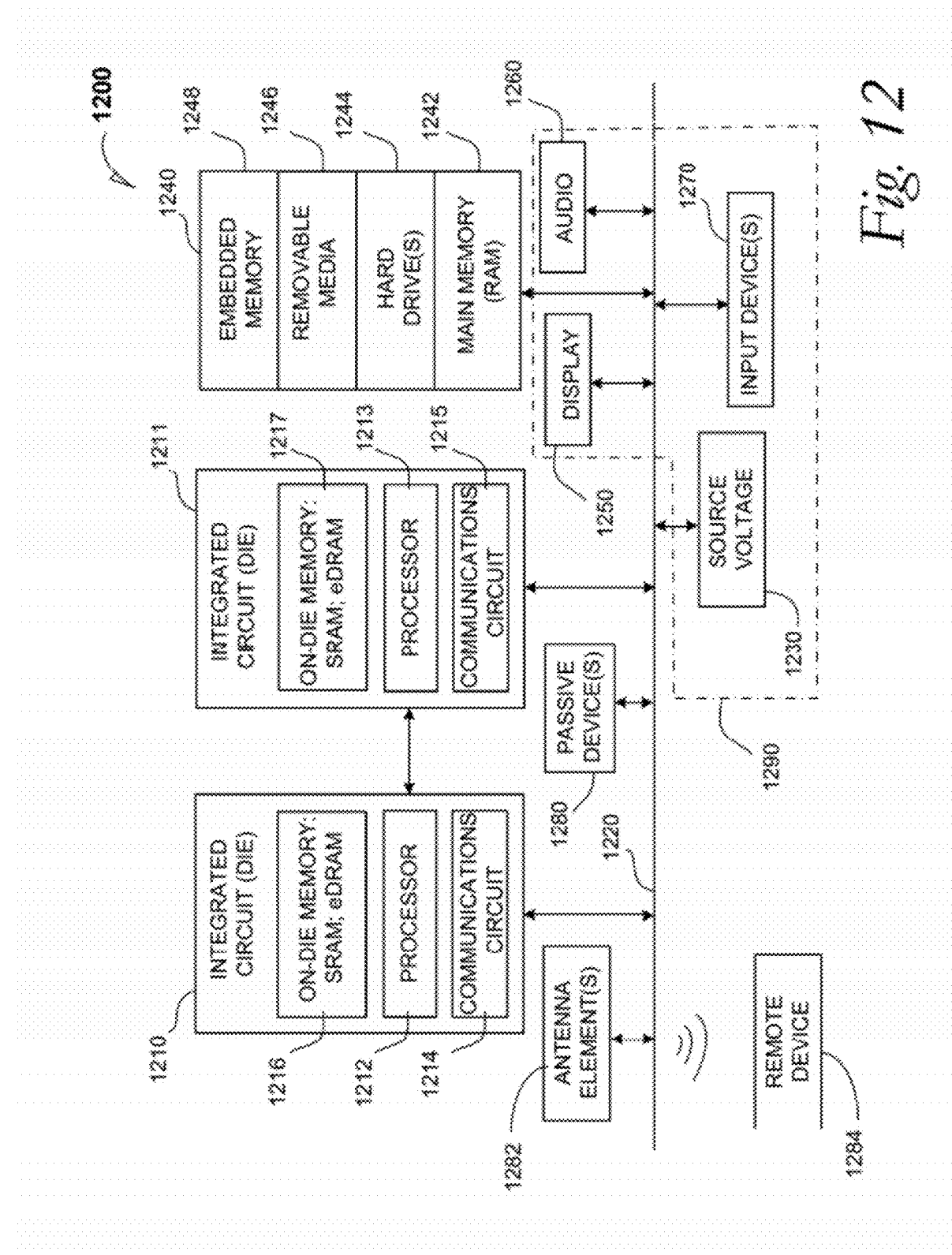

HIGH PERFORMANCE GLASS-BASED 60 GHZ / MM-WAVE PHASED ARRAY ANTENNAS AND METHODS OF MAKING SAME

RELATED APPLICATIONS

This disclosure is related to U.S. Patent Applications (Ser. Nos. 13/101,883 and 13/101,874) filed on even date herewith, the disclosures of which are incorporated herein by specific reference.

TECHNICAL FIELD

Disclosed embodiments relate to phased-array antenna substrates for packaged radio-frequency integrated circuits and methods of forming the substrates.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which:

FIG. 3 is a cross-section elevation of the phased-array antenna radio-frequency integrated-circuit chip apparatus mounted on a secondary low-cost package depicted in FIG. 2 and taken along the cross-section line 3-3 according to an embodiment;

FIG. 4 is a detail cross-section elevation of the phased-array antenna radio-frequency integrated-circuit chip apparatus mounted on a secondary low-cost package depicted in FIG. 3 according to an embodiment;

FIGS. 5a-5h are cross-section elevations of the low-loss phased-array antenna depicted in FIG. 5 during processing according to several embodiments;

FIG. 5f-l is a perspective cut-away and part wire-frame elevation detail of the PAA antenna depicted in FIG. 5 during processing according to an example embodiment;

FIGS. 5k, 5m, and 5n are exposed-layer plan views of the top, low-loss phased-array antenna depicted in FIG. 5 according to example embodiments;

FIG. is a process and method flow diagram according to an example embodiment; and FIG. 12 is a schematic of a computer system according to an embodiment.

DETAILED DESCRIPTION

Processes are disclosed where through-silicon-via radio-frequency integrated circuit (TSV RFIC) dice are assembled to phased-array antenna substrates. The phased-array antenna substrates have cavities disposed below individual antenna elements.

Reference will now be made to the drawings wherein like structures may be provided with like suffix reference designations. In order to show the structures of various embodiments more clearly, the drawings included herein are diagrammatic representations of integrated circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings.

Figure 1:
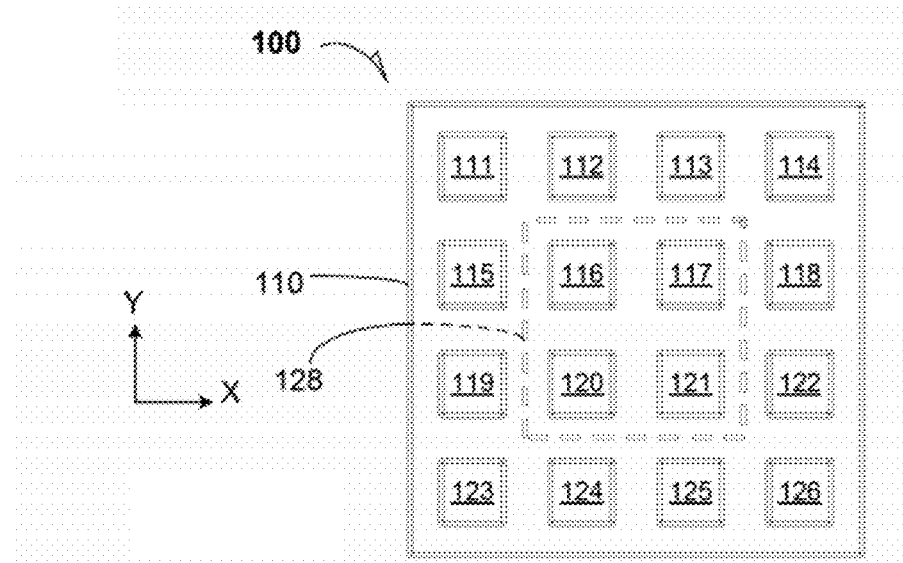
FIG. 1 is top plan of a vertically integrated phased-array antenna radio-frequency integrated-circuit chip apparatus according to an example embodiment.

FIG. 1 is top plan of a phased-array antenna radio-frequency integrated-circuit chip apparatus 100 according to an example embodiment. A phased-array antenna (PAA) substrate 110 is depicted in simplified form with a 4×4 array of planar antenna elements 111, 112, 113, 114, 115, 116, 117, 118, 119, 120, 121, 123, 124, 125, and 126. The PAA elements are deployed in rows of 4-4-4-4. In this embodiment, eight of the PAA elements are receiver elements and 8 PAA elements are transmitter elements. In an embodiment, the number of PAA elements is in a range from 4 to 64. In an embodiment, the number of PAA elements is 36 in a 6×6 array in which 18 PAA elements are receiver elements and 18 PAA elements are transmitter elements. In an embodiment, the number of PAA elements is 64 in a 8×8 array in which 32 PAA elements are receiver elements and 32 PAA elements are transmitter elements. In an embodiment, the 64 elements are split into many arrays. For example, four 4×4 arrays are configured, each from which two antenna elements are configured for Receive and two are configured for Transmit. In an embodiment, a 32-element phased-array antenna is split into many arrays. For example, two 4×4 arrays are configured, each from which two antenna elements are configured for Receive and two are configured for Transmit.

A through-silicon via (TSV) die 128 is depicted in phantom lines below the PAA substrate 110 and the TSV die 128 is vertically integrated (Z-direction) with the PAA substrate 110. In an embodiment, the TSV die 128 includes active and passive circuitry in semiconductive material. For example, the TSV die 128 is part of a processor manufactured by Intel Corporation of Santa Clara, Calif. In an embodiment, the TSV die 128 contains a system-on-chip (SoC) 128 such as a dual-processor microelectronic device. In an embodiment, the TSV die 128 includes a digital processor and radio-frequency integrated circuit (DP-RFIC) hybrid device 128. In an embodiment, the TSV die 128 includes an SoC 128 that includes a DP and a graphics (DP-GIC) hybrid such as the type codenamed Sandy Bridge and manufactured by Intel Corporation.

In an embodiment, the TSV die 128 is a radio-frequency integrated circuit (RFIC) TSV die 128. It can be seen that the TSV RFIC die 128 has a footprint that is smaller than that of the PAA substrate 110 and that the PAA substrate 110 is symmetrically disposed above the TSV RFIC die 128. As depicted, a quadrilateral symmetry is seen between the PAA substrate 110 and the TSV RFIC die 128. "Quadrilateral symmetry" may be understood to be that starting at the X-Y center of the apparatus 100, a PAA element that is encountered may be balanced by encountering an analogous PAA element when moving in the opposite direction along the same line taken. Although the planar antenna elements are depicted in a quadrilateral symmetry, they may be deployed in other configurations such as in radial symmetry. The planar antenna elements may also be deployed such as in rows of 3-5-5-3, which is a 16-element array that is not a perfect geometrical square although 16 is a perfect numerical square. The planar antenna elements may also be deployed such as in rows of 4-6-6-6-6-4, which is a 32-element array that is not a perfect square.

By being able to dispose the TSV RFIC die 128 directly below the PAA substrate 110, it is useful to achieve more uniform impedances, signal attenuations and phase delay therebetween. Uniform impedances may mean that the apparatus 100 may operate such that no significant differences in line impedance may be observed when comparing operation of any two antenna elements on the PAA substrate in a given application. Additionally by being able to dispose the TSV RFIC die 128 directly below the PAA substrate 110, a useful smaller apparatus is achieved that facilitates miniaturization of packaging.

Figure 2:
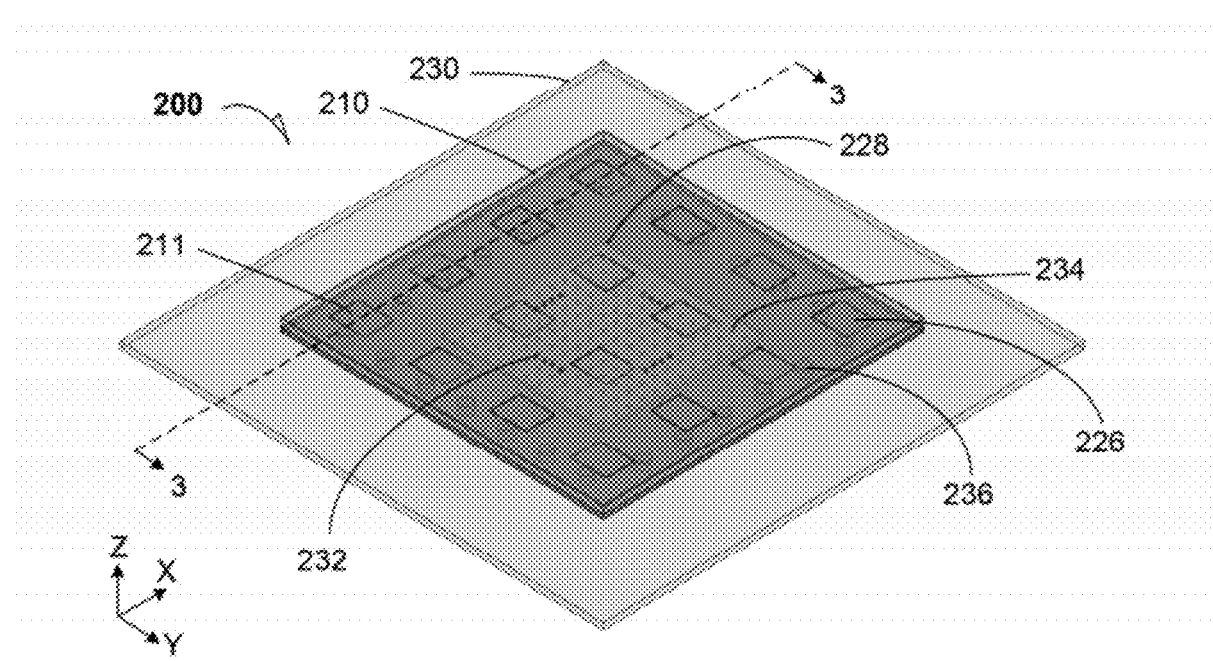
FIG. 2 is a perspective elevation of a phased-array antenna radio-frequency integrated-circuit chip apparatus mounted on a secondary low-cost package according to an embodiment.

FIG. 2 is a perspective elevation of a phased-array antenna radio-frequency integrated-circuit chip apparatus 200 mounted on a secondary low-cost package 230 (also referred to as a board 230) according to an embodiment. In an embodiment, the board 230 is a direct chip-attach (DCA) board 230. Where a secondary low-cost package 230 is used, the removal of RF/mm-wave signals allows a wider pitch to low frequency signals on the board 230. This makes it possible to attach die first-level interconnects such as controlled-collapse chip connection (C4) bumps directly to the board 230.

The apparatus 200 is depicted in partial wire frame in order to illustrate positioning of a TSV RIFC die 228 disposed below (Z-direction) a PAA substrate 210. A 4×4 PAA configuration of planar antennas is disposed on the PAA substrate 210, one of which is indicated with reference numeral 211.

The TSV RFIC die 228 is illustrated with 16 through-silicon vias that are in groups of four, four or which are indicated with reference numeral 232. Each one of the 16 TSVs 232 is coupled to a corresponding planar antenna element such as the planar antenna element 211. Additional TSVs not shown in FIG. 2 may be used to provide proper electrical ground reference to the 16 signal TSVs 232. The TSV RFIC die 228 is flip-chip mounted to a direct chip-attach (DCA) board 230 by a plurality of electrical bumps 234, one of which is indicated with reference numeral 234. The electrical bumps 234 are first-level interconnect bumps such as C4 bumps that are attached to the active side of a die. As illustrated, the electrical bumps are configured in a 12×12 array, but other bump counts may be used where needed. Additional dummy bumps, one of which is indicated with reference numeral 236 are deployed between the PAA substrate 210 and the secondary low-cost package 230. The dummy bumps 236 bridge the gap between the PAA substrate 210 and the secondary low-cost package 230 and add mechanical and thermal-stress stability to the apparatus 200 and the secondary low-cost package 230. In an embodiment, electrical grounding capabilities are achieved through the dummy bumps 236 for at least the PAA substrate 210 and the TSV RFIC 228.

FIG. 3 is a cross-section elevation of the phased-array antenna radio-frequency integrated-circuit chip apparatus 300 mounted on a direct-chip-attach board 230 depicted in FIG. 2 and taken along the cross-section line 3-3 according to an embodiment. The apparatus 300 includes the PAA substrate 210 and the TSV RFIC 228. Additionally, the secondary low-cost package 230 is coupled to the PAA substrate 210 by backside electrical bumps 238. A plurality of TSVs can be seen in the TSV RFIC 228, two of which are indicated with the reference numeral 232. Other structures may be seen in FIG. 3. Where the TSV RFIC 228 is an active RF device with RF and millimeter wave signals being transmitted through TSVs to the phased-array antenna, lower frequency functions are separated from the PAA substrate 210 and contained in the secondary low-cost package 230. This vertical integration system reduces signal congestion and facilitates a small form factor that is limited by dimensions of the PAA substrate 210. In an embodiment, the PAA substrate 210 operates in the 60 GHz realm while the secondary low-cost package 230 operates at lower frequencies.

In an embodiment, a 60 GHz or millimeter-wave phased array or millimeter-wave including the planar antenna elements 211, 212, 213, and 214 is assembled to a millimeter-wave (mm-wave) TSV RFIC 228 that requires a Gb/s datarate over a wireless link. In an embodiment, the wireless link is for a wireless display from a wireless transmission for uncompressed high-definition (HD) video.

FIG. 4 is a cross-section elevation detail of the phased-array antenna radio-frequency integrated-circuit chip apparatus mounted on a direct-chip-attach board depicted in FIG. 3 according to an embodiment. The apparatus 400 includes the PAA substrate 210 and the TSV RFIC 228. The apparatus 400 is mounted on the secondary low-cost package 230.

The PAA substrate 210 is illustrated with two occurrences of the planar antenna elements 212 and 213 that are exposed through an array mask 240. Below the planar antenna elements 212 and 213 are corresponding cavities 255 that allow for useful bandwidth enhancement. In an embodiment, a metallic layer 242 is disposed in the PAA substrate 210 to enhance antenna bandwidth. Electrical contact between the TSV RFIC 228 and the antenna elements is accomplished through at least one trace 244 that is coupled to the TSVs 232 through backside bumps 238. Electrical coupling of the antenna elements 212 and 213 through the PAA substrate 210 is accomplished either by inductive or direct via coupling. In an embodiment, the PAA substrate 210 includes a first dielectric layer 252 and a second dielectric layer 254 that is mated to the first dielectric layer 242. In an embodiment, the first dielectric layer 252 has a higher dielectric constant than the second dielectric layer 254. The second dielectric layer 254 is a glass material. In an embodiment, the first dielectric layer 252 is a glass material. In an embodiment, the first dielectric layer 252 is an organic material. In an embodiment, the first dielectric layer 252 is a ceramic material. In an embodiment, the first dielectric layer 252 is an inorganic material such as alumina.

The second dielectric layer 254 also is configured with a plurality of cavities 255 each of which is aligned below an antenna element such as the antenna elements 212 and 213. It can be seen that the second dielectric layer 254 has a thickness 256 that extends between the antenna elements and the metallic layer 242. Below each antenna element 212, the cavity 255 reduces the effective thickness of the second dielectric layer 254 to a remainder thickness 257 and any substance such as air that is disposed in the cavity 255. In an embodiment, the cavity 255 is open to external environments (see FIG. 5j) such that external environment changes may allow the cavity 255 to breathe in changing external pressures.

The TSV RFIC 228 includes an active-device layer 250 that exhibits an active surface 227. The metallization is indicated in part with a top bond pad 251. The active surface 227 is opposite a die backside surface 229. The metallization layer 251 may also be referred to as the silicon backend 251. In an embodiment, the metallization layer 251 has several layers of metallization such as metal-1 (M1) to M12 depending upon a given need for the TSV RFIC 228. In any event the TSVs 232 originate in the metallization layer 251 and penetrate the TSV RVIC 228 to the backside surface 229 in order to allow the TSV RVIC 228 to communicate with the antenna elements of the PAA substrate 210. The TSVs 232 make electrical contact to the backside bumps 238 and are therefore coupled to the antenna elements 212 and 213.

The secondary low-cost package 230 is coupled to the TSV RFIC 228 by the electrical bumps 234 and to the PAA substrate 210 by the dummy bumps 236 (see FIG. 3). In an embodiment, the secondary low-cost package 230 is a first-level chip-attach substrate and a land surface 231 is provided as a second-level chip-attach surface. In an embodiment, the land surface 231 is a land-grid array surface 231. In an embodiment, the land surface 231 is a pin-grid array surface 231

Figure 5:
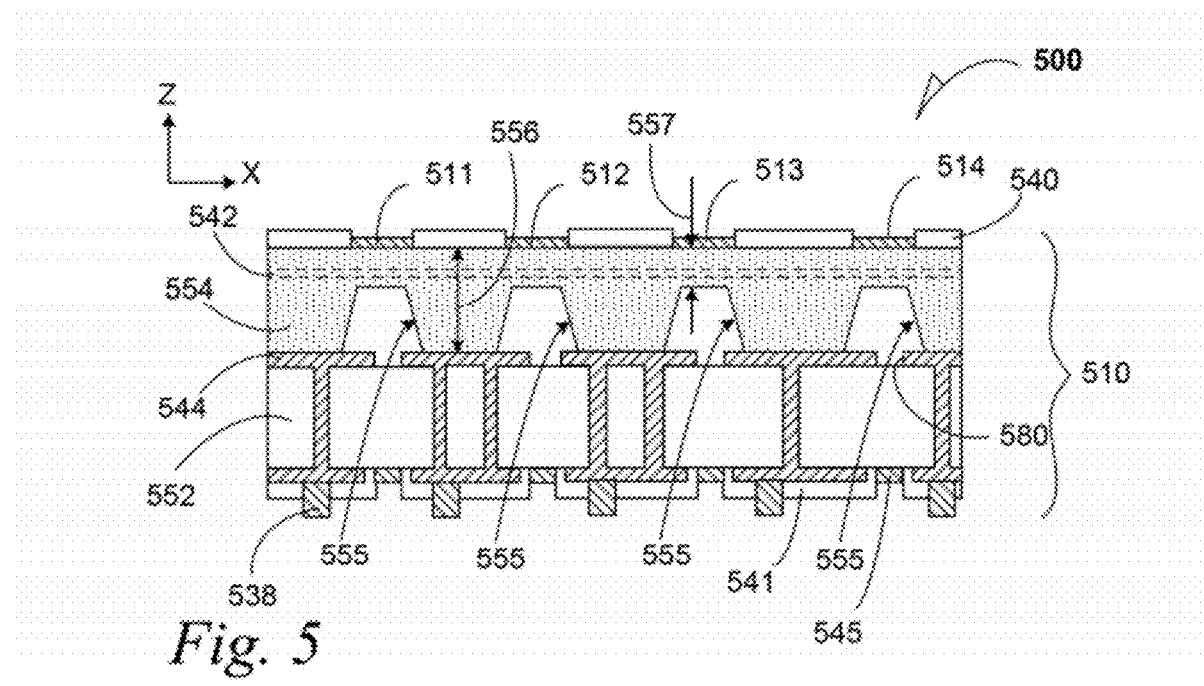
FIG. 5 is a detail cross-section elevation of a top, low-loss phased-array antenna according to an example embodiment.

FIG. 5 is a detail cross-section elevation of a top, low-loss phased-array antenna 500 according to an example embodiment. The antenna 500 is part of a PAA substrate 510. The PAA substrate 510 is illustrated with four occurrences of planar antenna elements 511, 512, 513, and 514 that are exposed through an array mask 540 that may be about 20 micrometer (µm) in thickness. In an embodiment, the array mask 540 is a passivation layer that encapsulates the planar antenna elements. As depicted, the planar antenna elements 511, 512, 513, and 514 are exposed at a top surface but they are covered on a bottom surface thereof with a second dielectric layer 554.

Cavities 555 are disposed in the PAA substrate 510 below each of the planar antenna elements to facilitate useful bandwidth enhancement. In an embodiment, a metallic layer 542 is disposed in the PAA substrate 510 to enhance antenna bandwidth.

Electrical contact between a TSV RFIC and the antenna elements 511, 512, 513, and 514 is accomplished through at least one trace 544 that is to be coupled to TSVs through backside bumps 538 that are disposed between a TSV RFIC and the PAA substrate 510. The trace 544 may be a ground plane with an aperture 580 that facilitates inductive coupling between an emitter trace 545 and a corresponding planar antenna element 514. It can be seen that the emitter trace 545, the cavity 555, and the planar antenna element are vertically aligned. The trace 544 is protected by a solder resist 541 that may have a thickness of about 20 µm. Electrical bumps 538 are provided through the solder resist 541 to couple the PAA 510 to a device such as a TSV RFIC. Electrical coupling of the antenna elements 511, 512, 513, and 514 through the PAA substrate 510 is accomplished by inductive coupling where an emitter trace 545 emits EM waves onto the antenna elements 511, 512, 513, and 514 through both a high-k dielectric 552 such as a glass material and a lower-k dielectric layer 554 that includes the cavities 555.

It can be seen that the second dielectric 554 has a thickness 556 that extends between the antenna elements and the trace 544. Below each antenna element 511, 512, 513, and 514, the cavity 555 reduces the effective thickness of the second dielectric 554 to a remainder thickness 557 and any ambient substance such as air that is disposed in the cavity 555. In an embodiment, the cavity 555 is open to external environments such that external environment changes may allow the cavities 555 to breathe in changing external pressures.

The lower-k dielectric layer 554 may also be a glass material. In an embodiment, the first dielectric layer 652 has an Er of about 5.5, a tan_delta of about 0.001, and a thickness of about 100 µm and the lower-k dielectric layer 654 has an Er from about 2.0 to 2.5, a tan_delta of about 0.001, and a thickness from about 250 µm to about 400 µm.

FIGS. 5a-5h are cross-section elevations of the low-loss phased-array antenna depicted in FIG. 5 during processing according to several embodiments. FIG. 5a is a cross-section elevation of the top, low-loss phased-array antenna depicted in FIG. 5 during fabrication according to an example embodiment. The material that will become the second dielectric 554 is overlaid with a metallic material that will become the antenna elements 511 such as by electroless plating.

FIG. 5b is a cross-section elevation of the PAA substrate depicted in 5a after further processing according to an embodiment. An array of planar antenna elements 511, 512, 513, and 514 has been patterned from the metallic material depicted in FIG. 5a to form the phased-array antenna. In FIG. 5c, further processing has been done by affixing a passivation layer 540 to protect the PAA elements 511, 512, 513, and 514. In an embodiment, the array mask 540 is patterned to exosed the PAA elements 511-514 from above (Z-direction).

In FIG. 5d, further processing has been done by forming a plurality of cavities 555 below each of the PAA elements 511, 512, 513, and 514. Processing may be done such as laser drilling to form the cavity 555. In an embodiment, drill-bit drilling is carried out. In an embodiment, laser drilling is carried out. In an embodiment, first drill-bit drilling is done, followed by laser-drill finishing. In an embodiment, shallow trenches 592 are formed between adjacent cavities to facilitate ambient condition adjustments.

Figures 1, 5F:
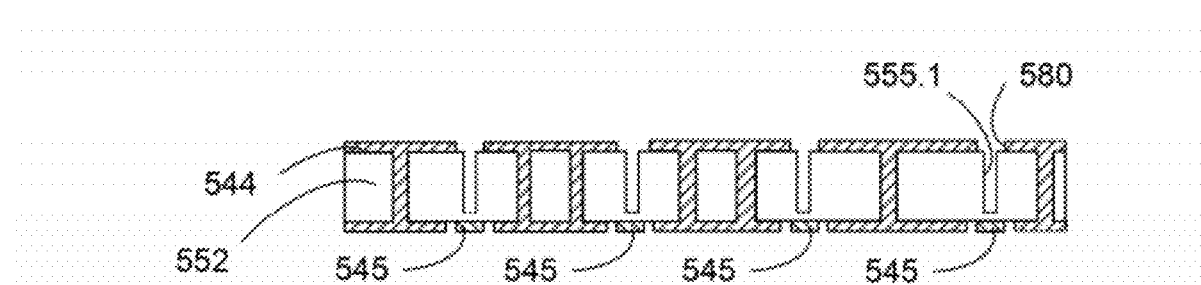

FIG. 5e is a cross-section elevation of the PAA substrate depicted in FIG. 5 during processing according to an embodiment. It is here observed that the second dielectric 554 is made separately from the first dielectric, followed by joining them to form the PAA substrate 500 depicted in FIG. 5. The first dielectric 552 has been overlaid with metallic material that will form part of the trace 544. In FIG. 5f, processing has been done to pattern the trace 544 and to electrically couple both traces by forming filled electrical vias therebetween. Further processing has also been done to assemble both form emitter traces 545 that correspond to the plurality of PAA elements that are affixed to the second dielectric 554 seen in FIG. 5d.

FIG. 5f-1 is cross-section elevation of a the first dielectric layer 552 during processing in contrast to the structure depicted in FIG. 5f. A first-dielectric layer cavity 555.1 is formed incidental to via formation such that the cavity 555.1 enhances the cavity 555 depicted for example in the second dielectric layer 554 at FIG. 5d.

At FIG. 5g, a solder resist 541 has been formed over the emitter traces 545 and the trace 544. At FIG. 5h, patterning of the solder resist 541 had been done to expose the emitter traces 545 as well as electrical bumps 538 have been formed to communicate with the trace 544.

Figure 6:
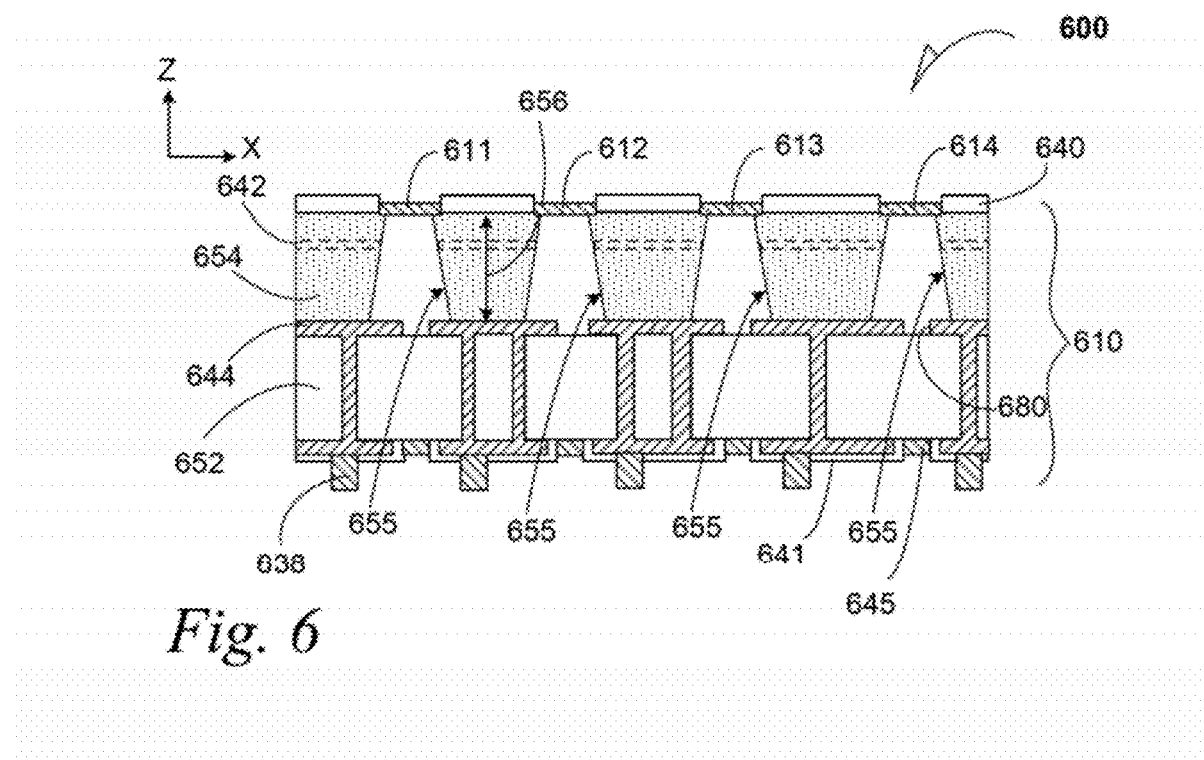
FIG. 6 is a detail cross-section elevation of a top, low-loss phased-array antenna 600 according to an example embodiment.

FIG. 6 is a detail cross-section elevation of a top, low-loss phased-array antenna 600 according to an example embodiment. The antenna 600 is part of a PAA substrate 610. The PAA substrate 610 is illustrated with four occurrences of planar antenna elements 611, 612, 613, and 614 that are exposed through an array mask 640 that may be about 20 μm in thickness. In an embodiment, the array mask 640 is a passivation layer that encapsulates the planar antenna elements from below (within the substrate 610). As depicted, the planar antenna elements 511, 512, 513, and 514 are exposed at a top surface and they are also exposed on a bottom surface thereof by their corresponding cavity 655.

Cavities 655 are disposed in the PAA substrate 610 below each of the planar antenna elements to facilitate useful bandwidth enhancement. As depicted, the cavities 655 extend vertically to expose the planar antenna elements. In an embodiment, a metallic layer 642 is disposed in the PAA substrate 610 to enhance antenna bandwidth.

Electrical contact between a TSV RFIC and the antenna elements 611, 612, 613, and 614 is accomplished through at least one trace 644 that is to be coupled to TSVs through backside bumps that are disposed between a TSV RFIC and the PAA substrate 610. The trace 644 may be a ground plane with an aperture 680 that facilitates inductive coupling between an emitter trace 645. The trace 644 is protected by a solder resist 641 that may have a thickness of about 60 μm. Electrical bumps 638 are provided through the solder resist 641 to couple the PAA 610 to a device such as a TSV RFIC. Electrical coupling of the antenna elements 611, 612, 613, and 614 through the PAA substrate 610 is accomplished by inductive coupling where an emitter trace 645 emits EM waves onto the antenna elements 611, 612, 613, and 614 through a high-k dielectric 652 such as a glass material through cavities 655 in a lower-k dielectric layer 654

It can be seen that the second dielectric layer 654 has a thickness 656 that extends between the antenna elements and the trace 644. Below each antenna element 611, 612, 613, and 614, the cavity 655 reduces the effective thickness of the second dielectric layer 654 to essentially zero remainder thickness of the second dielectric layer 654 but it includes any ambient substance such as air that is disposed in the cavity 655. In an embodiment, the cavity 655 is open to external environments such that external environment changes may allow the cavities 655 to breathe in changing external pressures.

The lower-k dielectric layer 654 may also be a glass material. In an embodiment, the first dielectric layer 652 has an Er of about 5.5, a tan_delta of about 0.001, and a thickness of about 100 μm and the lower-k dielectric layer 654 has an Er from about 2.0 to 2.5, a tan_delta of about 0.001, and a thickness from about 250 μm to about 400 μm.

Figure 7D:
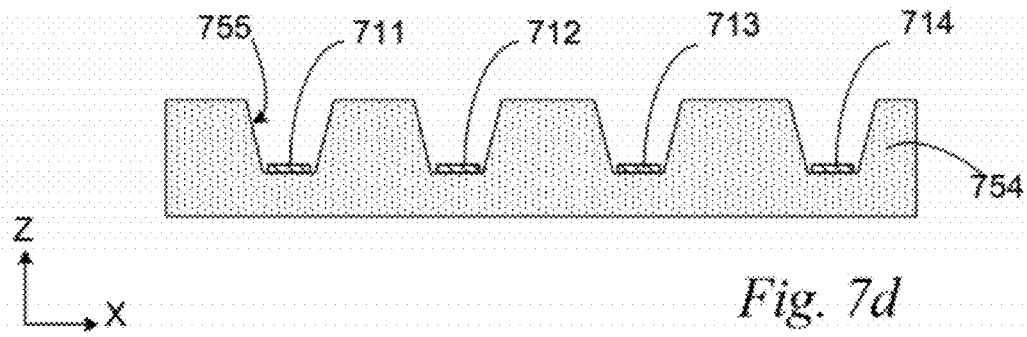
FIG. 7d is a cross-section elevation portion of the top, low-loss phased-array antenna depicted in FIG. 7 during processing according to an example embodiment.
Figure 7:
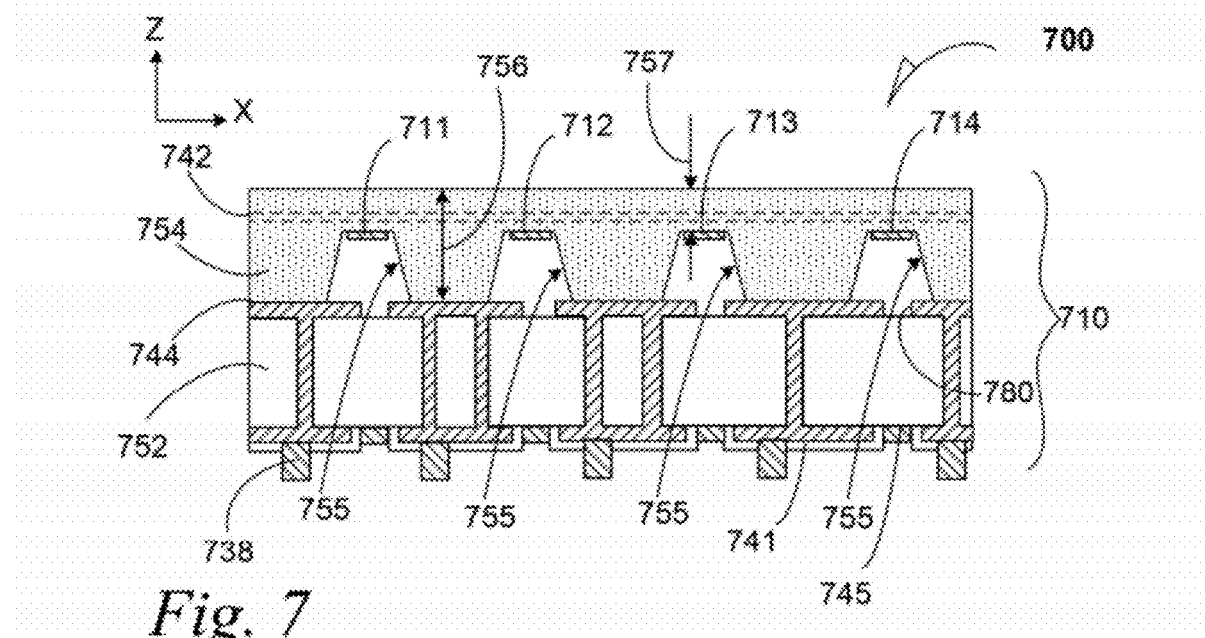
FIG. 7 is a detail cross-section elevation of a top, low-loss phased-array antenna according to an example embodiment.

FIG. 7 is a detail cross-section elevation of a top, low-loss phased-array antenna 700 according to an example embodiment. The antenna 700 is part of a PAA substrate 710. The PAA substrate 710 is illustrated with four occurrences of planar antenna elements 711, 712, 713, and 714 that are disposed inside cavities 755 of a lower-k dielectric layer 754. The cavities 755 are disposed in the PAA substrate 710 and each of the planar antenna elements is disposed in the cavities 755 to facilitate useful bandwidth enhancement. In an embodiment, a metallic layer 742 is disposed in the PAA substrate 710 to enhance antenna bandwidth.

Electrical contact between a TSV RFIC and the antenna elements 711, 712, 713, and 714 is accomplished through at least one trace 744 that is to be coupled to TSVs through backside bumps that are disposed between a TSV RFIC and the PAA substrate 710. The trace 744 may be a ground plane with an aperture 780 that facilitates inductive coupling between an emitter trace 745. The trace 744 is protected by a solder resist 741 that may have a thickness of about 20 μm. Electrical bumps 738 are provided through the solder resist 741 to couple the PAA 710 to a device such as a TSV RFIC. Electrical coupling of the antenna elements 711, 712, 713, and 714 through the PAA substrate 710 is accomplished by inductive coupling where an emitter trace 745 emits EM waves onto the antenna elements 711, 712, 713, and 714 through both a high-k dielectric 752 such as a glass material and a lower-k dielectric layer 754 that includes the cavities 755.

It can be seen that the second dielectric 754 has a thickness 756 that extends between the top (exterior) of the PAA substrate 710 and the trace 744. Below each antenna element 711, 712, 713, and 714, the cavity 755 reduces the effective thickness of the second dielectric 754 to a remainder thickness 757 and any substance such as air that is disposed in the cavity 755. In an embodiment, the cavity 755 is open to external environments such that external environment changes may allow the cavities 755 to breathe in changing external pressures.

The lower-k dielectric layer 754 may also be a glass material. In an embodiment, the first dielectric layer 752 has an Er of about 5.5, a tan_delta of about 0.001, and a thickness of about 100 μm and the lower-k dielectric layer 754 has an Er from about 2.0 to 2.5, a tan_delta of about 0.001, and a thickness from about 250 μm to about 400 μm.

Figure 8:
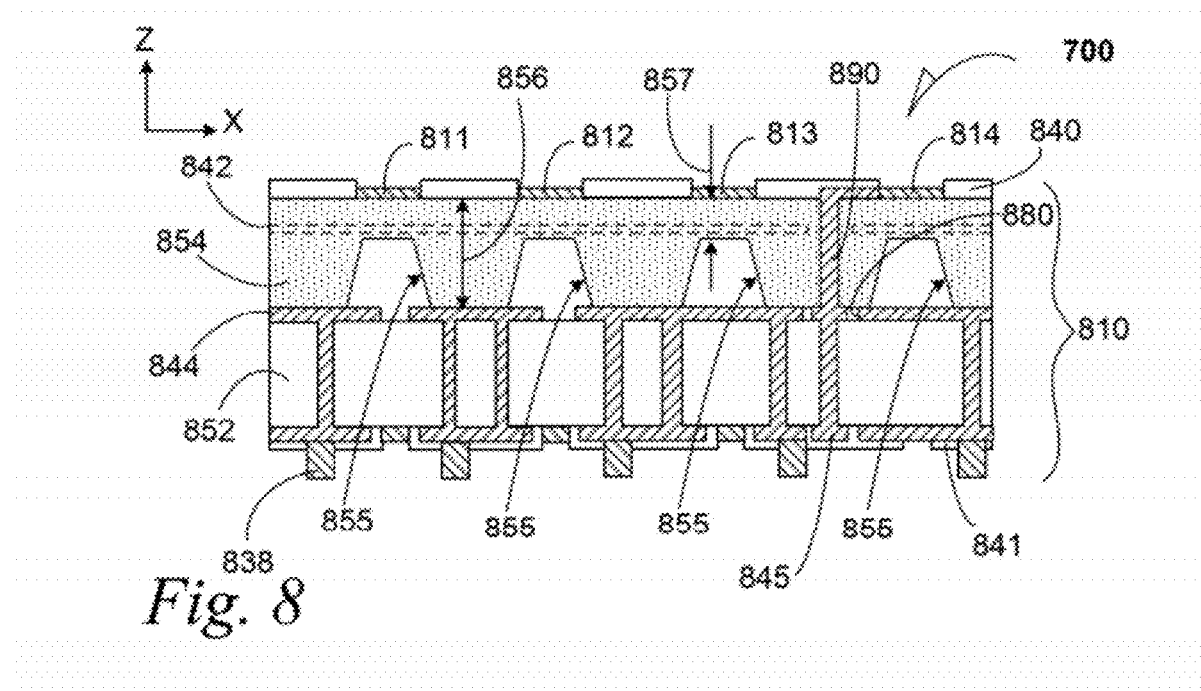
FIG. 8 is a detail cross-section elevation of a top, low-loss phased-array antenna according to an example embodiment.

FIG. 8 is a detail cross-section elevation of a top, low-loss phased-array antenna 800 according to an example embodiment. The antenna 800 is part of a PAA substrate 810. The PAA substrate 810 is illustrated with four occurrences of planar antenna elements 811, 812, 813, and 814 that are exposed through an array mask 840 that may be about 20 μm in thickness. Cavities 855 are disposed in the PAA substrate 810 below each of the planar antenna elements to facilitate useful bandwidth enhancement. In an embodiment, a metallic layer 842 is disposed in the PAA substrate 810 to enhance antenna bandwidth.

Electrical contact between a TSV RFIC and the antenna elements 811, 812, 813, and 814 is accomplished through at least one trace 844 that is to be coupled to TSVs through backside bumps that are disposed between a TSV RFIC and the PAA substrate 810. The trace 844 may be a ground plane with an aperture 880 that facilitates via coupling between an emitter trace 845. A via contact 890 passes through the aperture in the trace 844 and makes contact to the antenna element 814. Consequently in this embodiment, the antenna elements 814 is contacted by the via contact 890 from the emitter trace 845.

The trace 844 is protected by a solder resist 841 that may have a thickness of about 20 μm. Electrical bumps 838 are provided through the solder resist 841 to couple the PAA 810 to a device such as a TSV RFIC. Electrical contact of the antenna elements 811, 812, 813, and 814 through the PAA substrate 810 is accomplished by via contact 890.

It can be seen that the second dielectric 854 has a thickness 856 that extends between the antenna elements and the metallic layer 842. Below each antenna element 811, 812, 813, and 814, the cavity 855 reduces the effective thickness of the second dielectric 854 to a remainder thickness 857 and any substance such as air that is disposed in the cavity 855. In an embodiment, the cavity 855 is open to external environments such that external environment changes may allow the cavities 855 to breathe in changing external pressures.

Figure 6D:
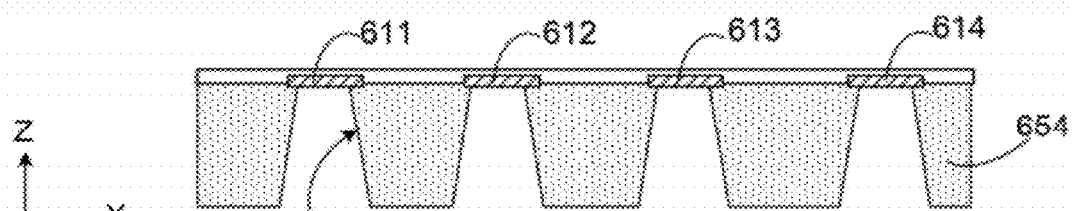
FIG. 6d is a cross-section elevation of a portion of the top, low-loss phased-array antenna depicted in FIG. 6 during processing according to an example embodiment.

FIG. 6d is a cross-section elevation of a portion of the top, low-loss phased-array antenna 600 depicted in FIG. 6 during processing according to an example embodiment. Processing of the PAA antenna 600 may be similar to that of the PAA antenna 500 depicted in FIGS. 5a-5c with a variation that forming the cavities 655 extends to expose the PAA elements 611, 612, 613, and 614 from below (within the PAA substrate 610). Etching or drilling of the cavities 655, or a combination thereof, is carried out with care given to leave lateral edges (X-Y directions) of the PAA elements affixed in the second dielectric 654. In an embodiment, a physical-drilling process is started to form cavity precursors, followed by a laser-drilling process that stops on the PAA elements.

FIG. 7d is a cross-section elevation portion of the top, low-loss phased-array antenna 700 depicted in FIG. 7 during processing according to an example embodiment. Processing of the PAA antenna 700 may be similar to that of the PAA antenna 500 depicted in FIGS. 5a-5c with a variation that forming the cavities 755 is followed by formation of the PAA elements 711, 712, 713, and 714 within the cavities. In a processing embodiment, etching or drilling of the cavities 755, or a combination thereof, is carried out. A metallic film is blanket formed over the topology of the cavities, followed by two directional etches that use the depth of the cavities 755 to protect the PAA elements 711, 712, 713, and 714. The PAA elements 711, 712, 713, and 714 are protected from etching by the depth of the cavities 755 and the shallow angle of the directional etches. Other processing methods may be used form the PAA elements 711, 712, 713, and 714 within the cavities 755. After formation of the PAA elements 711, 712, 713, and 714 within the cavities 755, the second dielectric layer 754 is inverted and assembled to the first dielectric layer 752 as illustrated in FIG. 7.

Figure 5J:
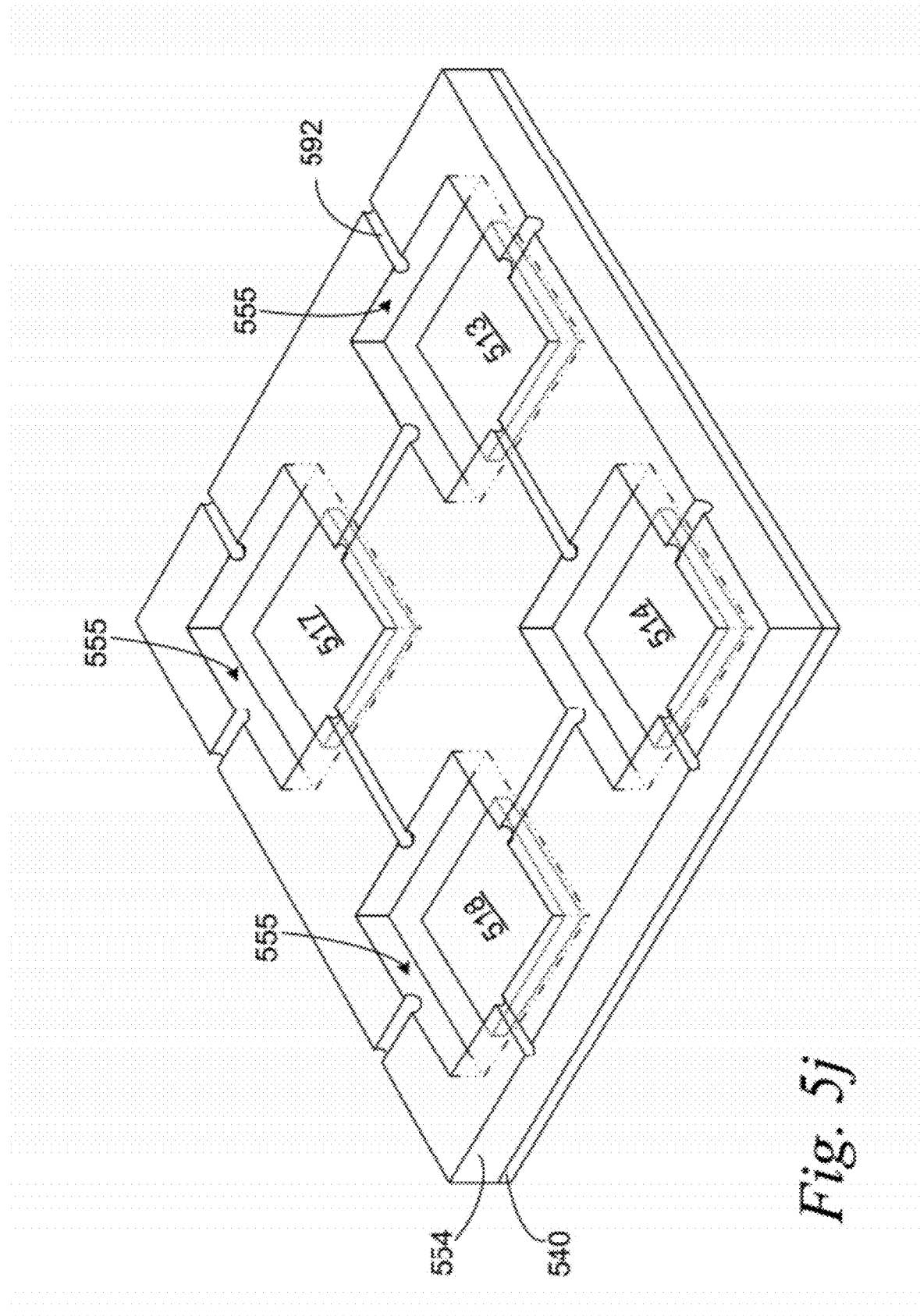
FIG. 5j is a perspective cut-away and part wire-frame elevation detail of the PAA antenna depicted in FIG. 5 during processing according to an example embodiment.

FIG. 5j is a perspective cut-away and part wire-frame elevation detail of the PAA antenna 500 depicted in FIG. 5 during processing according to an example embodiment. The structure is inverted with respect to the antenna 500 depicted in FIG. 5. Processing is at a state that is approximately equal to the structure depicted at FIG. 5d except for a detail cross-section is exposed that reveals the two antenna elements 513 and 514 seen in FIG. 5.

It can be seen that a shallow trench 592 has been formed in the base of the second dielectric layer 554. The shallow trench 592 allows for ambient gas equilibrium within the cavities 555 as well as moisture management therewithin.

In an embodiment, an antenna is tested on a glass substrate. A first antenna was tested with no cavities below the planar antenna elements. The first antenna tested at 3.6 GHz (where the frequency range at which the input return loss is less than −10 dB). A second antenna is tested with same-size and same-array configuration as the first antenna. The second antenna has cavity footprints that were equal to the area of the planar antenna elements. The second antenna had a cavity form factor similar to that depicted in FIG. 5, but without the structure 542. The footprint size is measured at the juncture of the trace 544 and the second dielectric layer 554. The second antenna tested at 4.7 GHz. A third antenna is tested with same-size and same-array details as the first antenna. The third antenna has cavity footprints that were larger than the area of the planar antenna elements, such as illustrated in FIG. 5j. The third antenna had a cavity form factor similar to that depicted in FIG. 5, but without the structure 542. The footprint size is measured at the juncture of the trace 544 and the second dielectric layer 554. The ratio of cavity footprint to antenna element was about 1.96. The third antenna tested at 5.1 GHz.

Figure 5K:
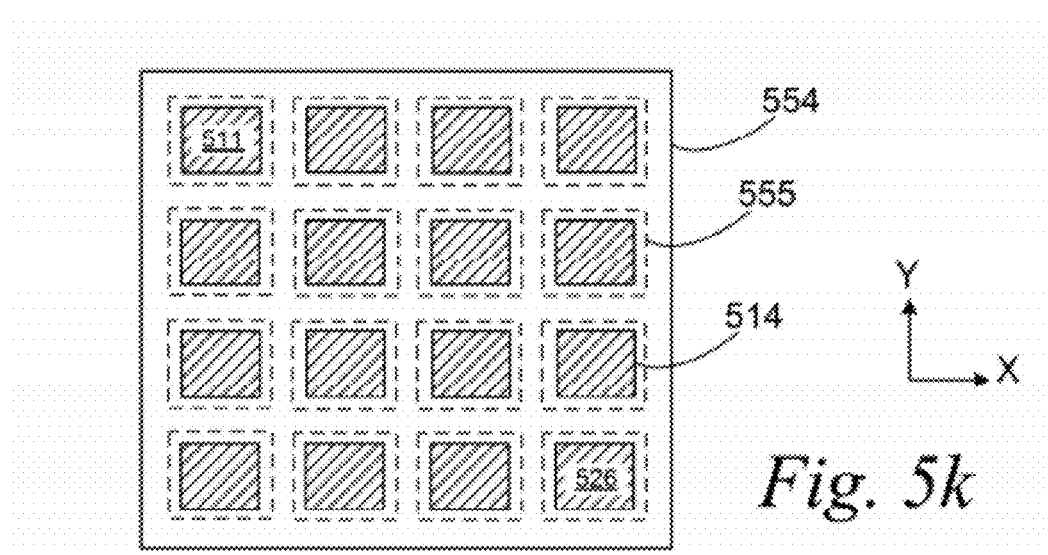
Figure 5M:
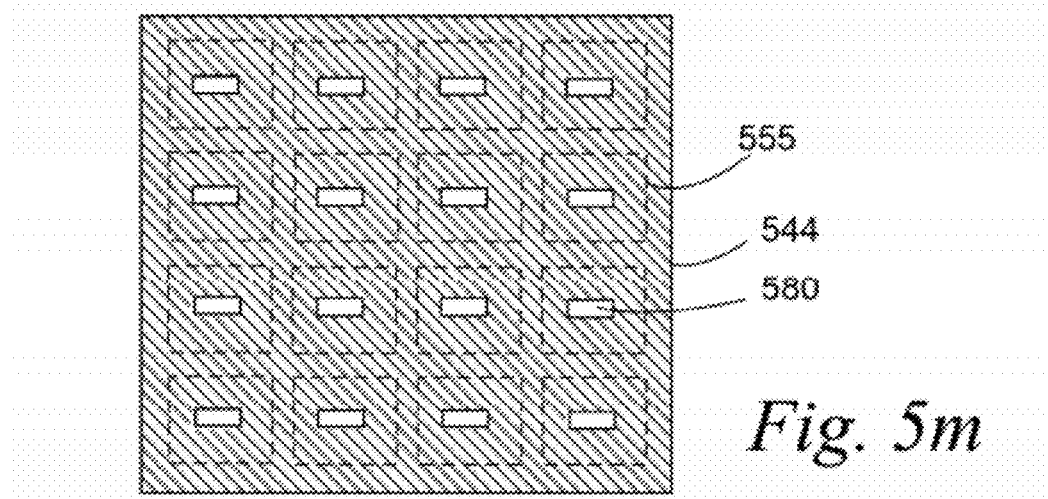
Figure 5N:
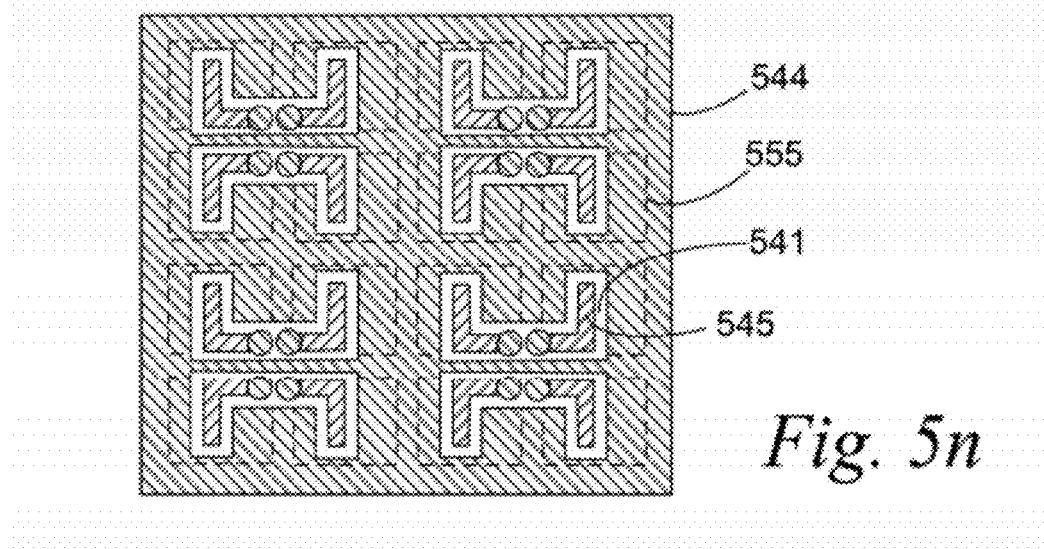

FIGS. 5k, 5m, and 5n are exposed-layer plan views of the top, low-loss phased-array antenna depicted in FIG. 5 according to example embodiments. FIG. 5k is a top plan of the PAA substrate 500 depicted in FIG. 5 according to an embodiment. The array of phased-array antenna elements 511-526 are shown upon the second dielectric 554 with the cavities 555 shown in phantom lines in the second dielectric layer 554. The cavities 555 are disposed below the array of phased-array antenna elements 511-526. The ratio of cavity footprint to antenna element area is about 1.96 according to an embodiment.

FIG. 5m is a cut-away top plan of a portion of the PAA substrate depicted in FIG. 5 according to an embodiment. The least one trace 544 is shown with the aperture 580 at the level in FIG. 5 where the second dielectric 554 mates to the at least one trace 544. Whereas the cavities 555 have a projected image in FIG. 5k, the cavities 555 have a footprint on the at least one trace 544.

FIG. 5n is a cut-away top plan of a portion of the PAA substrate depicted in FIG. 5 according to an embodiment. The lower portion of the at least one trace 544 is shown with the cavity footprints 555 projected thereon. The emitter trace 545 is shown in a dielectric insulator 541 that may be the solder mask material.

Figure 9:
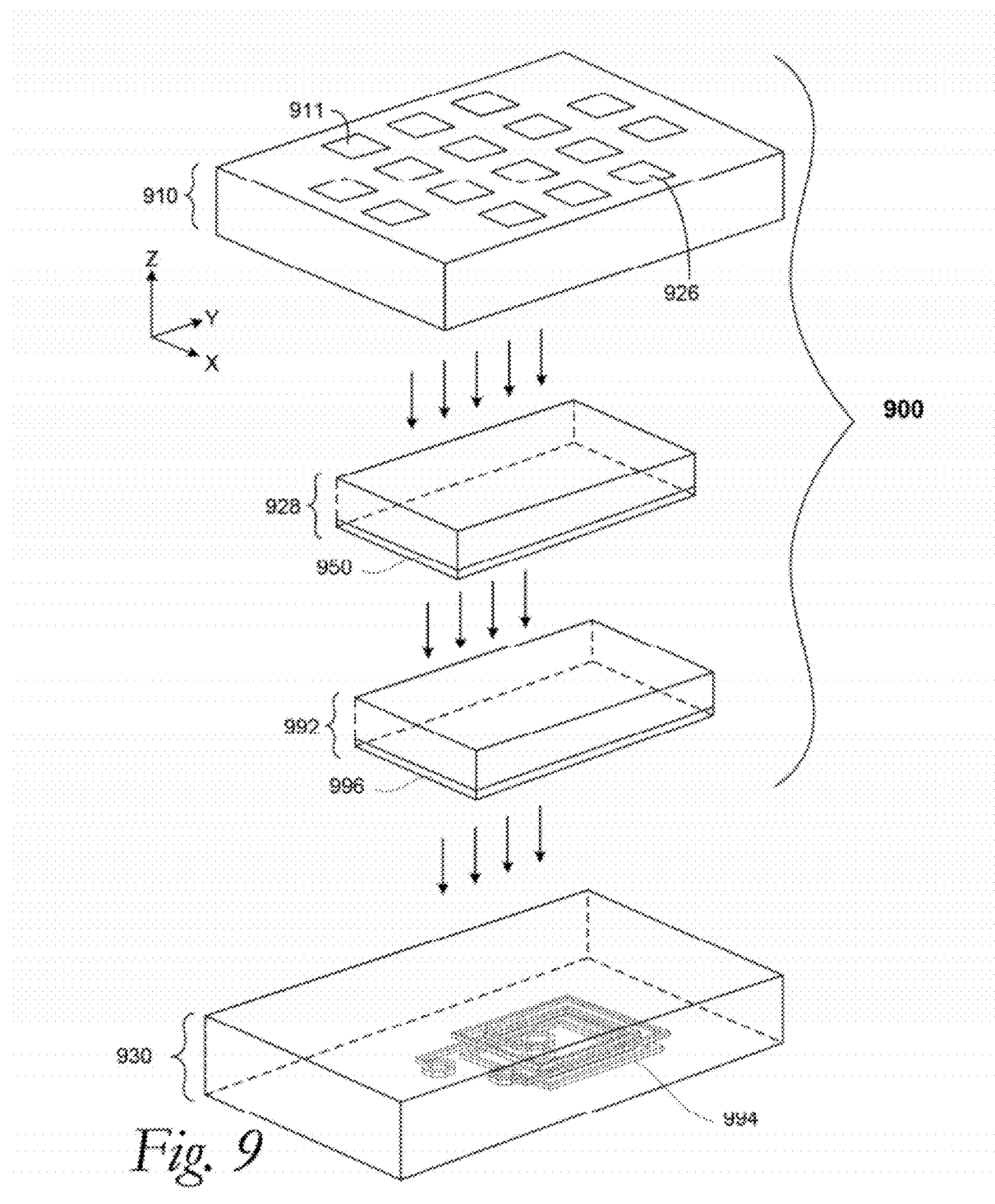
FIG. 9 is an exploded, wire-frame perspective of a phased-array antenna radio-frequency integrated-circuit chip apparatus that includes a through-silicon via RFIC chip that is mounted on a board such as a secondary low-cost package.

FIG. 9 is an exploded, wire-frame perspective of a phased-array antenna radio-frequency integrated-circuit chip apparatus 900 that includes a through-silicon via RFIC chip 928 that is mounted on a board 930 such as a secondary low-cost package. In an embodiment, the board 930 is a DCA package. In an embodiment, the board 930 includes an embedded passive device 994. As depicted, the apparatus 900 is configured with a TSV RFIC 928 and a PAA substrate 910 that includes cavities (not pictured) disposed below each planar antenna element. The PAA substrate 910 is depicted with 16 antenna elements 911 to 926 in a 3-5-5-3 (X-direction) configuration.

The TSV RFIC 928 is disposed above the secondary low-cost package 930 and a passive device 994, in this illustration a folded inductor 994, is embedded in the secondary low-cost package 930. In an embodiment, the apparatus includes the PAA substrate 910, the TSV RFIC 928, and also a TSV DP 992. In an embodiment, the device 992 is a memory die such as a solid-state drive (SSD) and the RF die 928 is an hybrid RF- and DP integrated circuit die 928. In an embodiment, the RF die 928 is supported by a hybrid DP-GIC die 992. In an embodiment, only the PAA substrate 910 and the TSV RFIC 928 are present. The apparatus 900 is depicted in simplified form that includes TSV DP metallization 996 that supports the TSV DP 992 and RFIC metallization 950 that supports the TSV RFIC 928.

In an embodiment, the TSV RFIC 928 is inverted compared to the orientation depicted in FIG. 9, such that the metallization 950 and the active surface abut the PAA substrate 910 for shorter connections to the antenna elements 911-926.

In an embodiment, the secondary low-cost package 930 is a coreless substrate 930 that includes at least one passive device embedded therein. Electrical communication between the DP-RFIC 992 and the secondary low-cost package 930 is carried out through electrical bumps according to any disclosed embodiment or otherwise according to known technique. As illustrated, the DP-RFIC 992, if present, is a flip-chip 992 that is being mated to the secondary low-cost package 930 by use of electrical bumps according to any disclosed embodiment or otherwise according to known technique. Other passive devices may be embedded in the secondary low-cost package according to any technique disclosed in PCT Patent Application No. PCT/US2010/061388, filed Dec. 20, 2010, the disclosure of which is incorporated herein in its entirety by reference.

Any RF-quality capacitors may be deployed within the silicon of the TSV RFIC 928 according to an embodiment. As a front-end module passive device, at least one RF-quality capacitor is deployed within the TSV RFIC 928 remains within the silicon of the TSV RFIC 928 where it may be fabricated with a high-k dielectric material for a useful capacitance and a useful small size compared to that of inductors that may be deployed within the secondary low-cost package 930.

Figure 10:
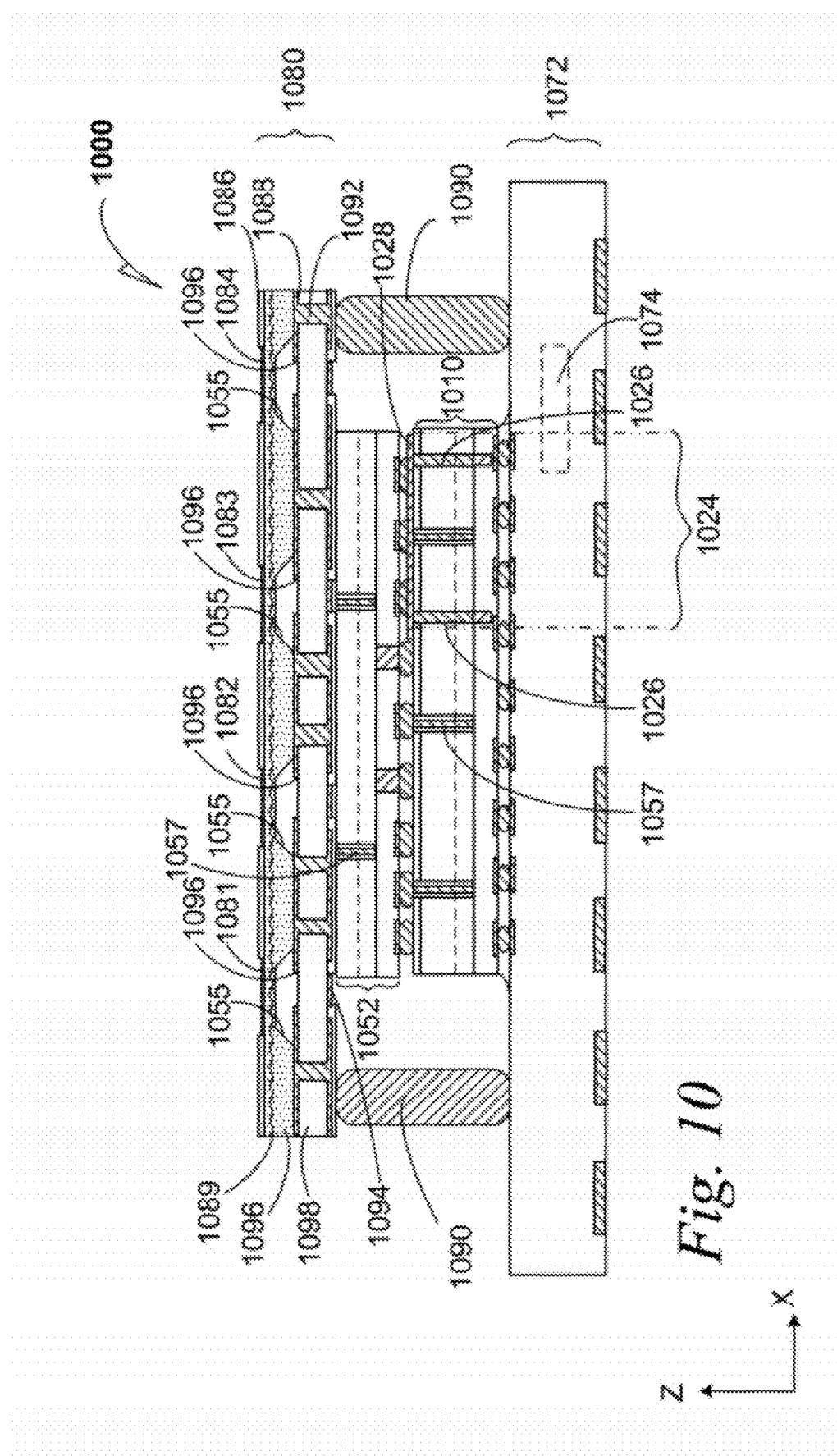
FIG. 10 is a cross-section elevation of a chip package that includes a phased-array antenna substrate with cavities according to an example embodiment.

FIG. 10 is a cross-section elevation of a chip package 1000 that includes a phased-array antenna substrate 1080 with cavities 1055 according to an example embodiment.

The chip package 1000 includes an RF die 1010. In an embodiment, a TSV subsequent digital-processor (DP) die 1052 also provided. A mounting substrate 1072 is also provided as well as the PAA substrate 1080. In an embodiment, the mounting substrate 1072 is a DCA board 1072. The TSV subsequent die 1052 is coupled to the PAA substrate 1080 though the RF die 1010.

The PAA substrate 1080 is illustrated with four occurrences of planar antenna elements 1081, 1082, 1083, and 1084 that are exposed through an array mask 1086. In an embodiment, the array mask 1086 is a passivation layer and the antenna elements are covered therewith. In an embodiment, a metallic layer 1088 with apertures 1096 is disposed in the PAA substrate 1080. In an embodiment, an additional metallic layer 1089 is provided to enhance antenna bandwidth. The ground plane 1088 is coupled to dummy bumps 1090 through ground vias 1092 in the PAA substrate 1080.

Electrical contact between the RF die 1010 and the antenna elements is accomplished through at least one emitter trace 1094. Electrical coupling of the antenna elements 1081, 1082, 1083, and 1084 through the PAA substrate 1080 is accomplished by aperture feeding of an inductive coupling including through apertures 1096 in the trace 1044 and through cavities 1055 in the second dielectric 1096. In an embodiment, the PAA substrate 1080 includes a first dielectric layer 1098 and a second dielectric layer 1096. In an embodiment, the first dielectric layer 1098 is glass and has a higher dielectric constant than the second dielectric layer 1096 which is also glass.

The RF die 1010 is coupled to the PAA substrate 1080 through at least one TSV 1057 and to the at least one emitter trace 1094. The at least one TSV 1057 is for one of signal and power and ground functions. In an embodiment, the RF die 1010 TSV signals are transmitted to the phased-array antenna elements, but lower frequency functions are separated from the PAA substrate 1080 and contained in the mounting substrate 1072. This integration system reduces signal congestion and facilitates a smaller X-Y form factor that is limited by dimensions of the PAA substrate 1080.

In addition to signal/power/ground TSVs 1057, at least one sector of the RF die 1010 is a shielded sector 1024 by virtue of shielding TSVs 1026 that form an enclosure 1026 and a backside shield 1028 that form a lattice lid 1028. It may now be understood the positions of the RF die 1010 and the DP die 1052 may be swapped and the active surface of the RF die 1010 may abut the PAA substrate 1080.

Figure 11:
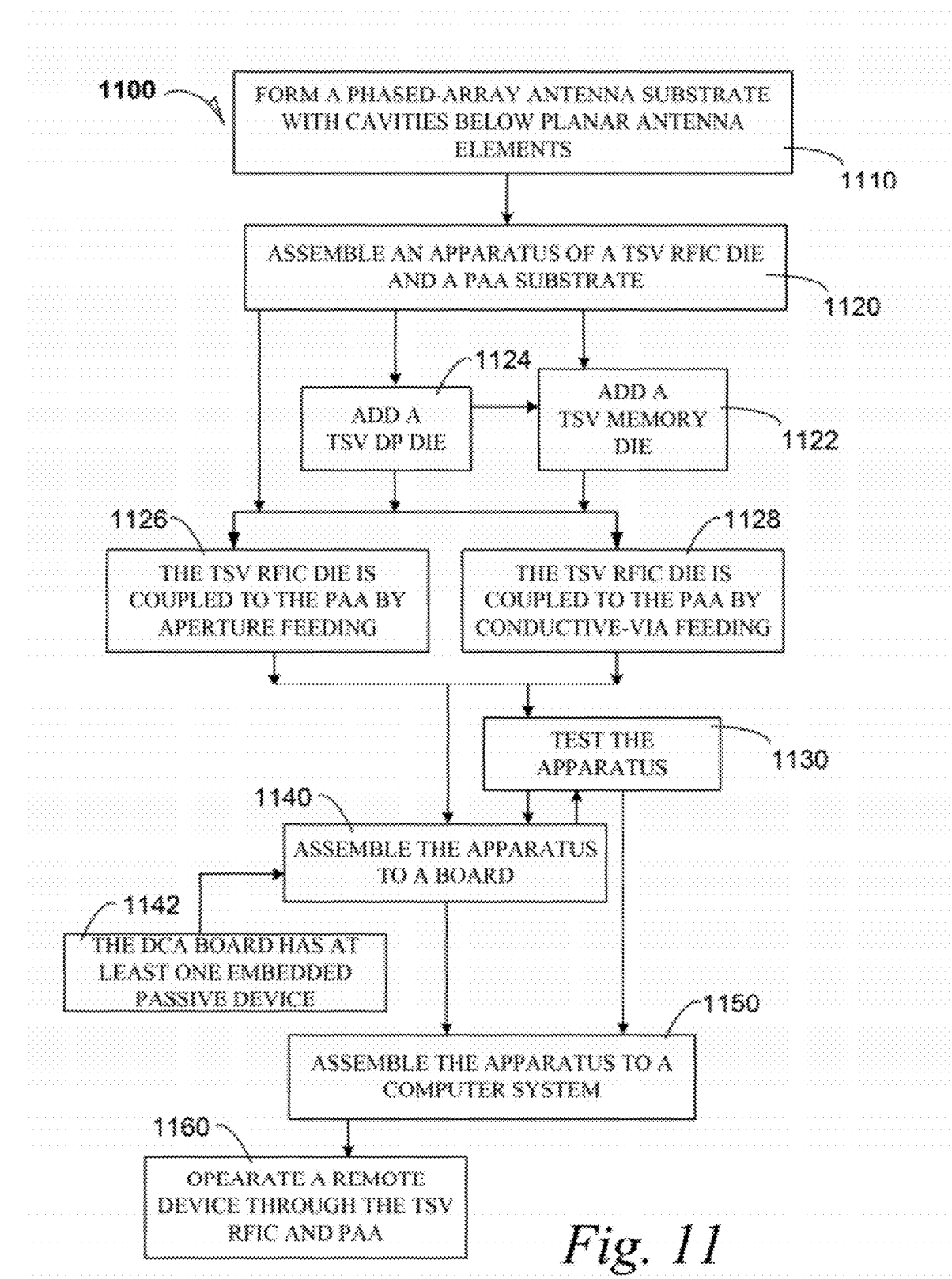

FIG. 11 is a process and method flow diagram 1100 according to an example embodiment.

At 1110, the process includes forming a phased-array antenna substrate with cavities below planar antenna elements. It is understood that the first dielectric and the second dielectric are fabricated separately and then assembled. In a non-limiting example embodiment, the second substrate 554 is fabricated by a different business entity from that that fabricates the first substrate 552.

In a non-limiting process embodiment, the cavity footprint is formed smaller than the area of the planar antenna element in a range from 50% the area to 99.9%. In a non-limiting process embodiment, the cavity footprint is formed equal to the area of the planar antenna element. In a non-limiting process embodiment, the cavity footprint is formed larger than the area of the planar antenna element in a range from 100.1% to 300%. In a non-limiting process embodiment, the cavity footprint is formed larger than the area of the planar antenna element by 196%.

At 1120, a method embodiment includes assembling an apparatus of a through-silicon via die and the phased-array antenna substrate. In a non-limiting example embodiment, the TSV RFIC 228, depicted in FIG. 3, is assembled to the PAA substrate 210. In a non-limiting example embodiment, the TSV RFIC die is assembled with the active surface thereof abutting the PAA substrate.

At 1122, a process embodiment includes assembling or adding a TSV memory die to the apparatus.

At 1124, a process embodiment includes assembling or adding a through-silicon via digital processor to the apparatus. In a non-limiting example embodiment, the TSV DP 1052 is added to the TSV RFIC 1010 as depicted in FIG. 1000.

At 1126, a process includes assembling the TSV RFIC to a PAA substrate such that electrical coupling is by aperture feeding between the TSV RFIC and the planar antenna elements of the PAA. In non-limiting example embodiments, aperture feeding couples the PAA substrates depicted in FIGS. 4, 5, 6, and 7 to respective RF dice.

At 1128, a process includes assembling the TSV RFIC to a PAA substrate such that electrical coupling is by conductive-via feeding between the TSV RFIC and the planar antenna elements of the PAA. In a non-limiting example embodiment, conductive-via feeding is used on the apparatus 800, depicted in FIG. 8.

At 1130, a method embodiment includes testing the apparatus. In a non-limiting example embodiment, the apparatus that consists essentially of the PAA substrate mated to the TSV RFIC is tested before assembling the apparatus to a secondary low-cost package. For example, a testing jig may have a similar electrical-contact footprint of that of the TSV RFIC such that testing may be done without a permanent secondary low-cost package affixed.

At 1140, a process embodiment includes assembling the apparatus to a board. In an embodiment, the board is a secondary low-cost package. In an embodiment, the board is a DCA board. In a non-limiting example embodiment, testing at 1140 is done after assembling the apparatus to the secondary low-cost package.

At 1142, a process embodiment includes fabricating at least one passive device in or on the board. In a non-limiting example embodiment, the folded inductor 994 is fabricated into a coreless secondary low-cost package 930 as depicted in FIG. 9. In an embodiment, a bump inductor is deployed between the secondary low-cost package and the TSV RFIC. In an embodiment, a stacked-via inductor is deployed between the TSV RFIC and at least partially in the secondary low-cost package 930.

At 1150, a method embodiment includes assembling the apparatus to a computer system. In a non-limiting example embodiment, the computer system depicted in FIG. 12 has functionalities of an antenna element such as any disclosed PAA substrate with cavities below the planar antenna elements in connection with this disclosure. In a non-limiting example embodiment, assembling the apparatus to a computer system is done where the board is a foundation substrate.

At 1160, a method embodiment includes operating a remote device through a TSV RFIC and PAA apparatus. In an embodiment, a remote device 1284 is operated by an apparatus embodiment by use of PAA elements 1282.

FIG. 12 is a schematic of a computer system according to an embodiment. The computer system 1200 (also referred to as the electronic system 1200) as depicted can embody an apparatus that includes a TSV RFIC mated to a PAA substrate with cavities according to any of the several disclosed embodiments and their equivalents as set forth in this disclosure. An apparatus that includes a TSV RFIC mated to a PAA substrate with cavities is assembled to a computer system. The computer system 1200 may be a mobile device such as a netbook computer. The computer system 1200 may be a mobile device such as a wireless smart phone. The computer system 1200 may be a desktop computer. The computer system 1200 may be a hand-held reader. The computer system 1200 may be integral to an automobile. The computer system 1200 may be integral to a television. The computer system 1200 may be integral to a dvd player. The computer system 1200 may be integral to a digital camcorder.

In an embodiment, the electronic system 1200 is a computer system that includes a system bus 1220 to electrically couple the various components of the electronic system 1200. The system bus 1220 is a single bus or any combination of busses according to various embodiments. The electronic system 1200 includes a voltage source 1230 that provides power to the integrated circuit 1210. In some embodiments, the voltage source 1230 supplies current to the integrated circuit 1210 through the system bus 1220.

The integrated circuit 1210 is electrically coupled to the system bus 1220 and includes any circuit, or combination of circuits according to an embodiment. In an embodiment, the integrated circuit 1210 includes a processor 1212 that can be of any type of an apparatus that includes a TSV RFIC mated to a PAA substrate with cavities embodiment. As used herein, the processor 1212 may mean any type of circuit such as, but not limited to, a microprocessor, a microcontroller, a graphics processor, a digital signal processor, or another processor. In an embodiment, the processor 1212 is the BBUL embedded TSV RFIC die disclosed herein. In an embodiment, SRAM embodiments are found in memory caches of the processor. Other types of circuits that can be included in the integrated circuit 1210 are a custom circuit or an application-specific integrated circuit (ASIC), such as a communications circuit 1214 for use in wireless devices such as cellular telephones, smart phones, pagers, portable computers, two-way radios, and similar electronic systems. In an embodiment, the processor 1210 includes on-die memory 1216 such as static random-access memory (SRAM). In an embodiment, the processor 1210 includes embedded on-die memory 1216 such as embedded dynamic random-access memory (eDRAM).

In an embodiment, the integrated circuit 1210 is complemented with a subsequent integrated circuit 1211 such as a graphics processor or a radio-frequency integrated circuit or both as set forth in this disclosure. In an embodiment, the dual integrated circuit 1210 includes embedded on-die memory 1217 such as eDRAM. The dual integrated circuit 1211 includes an RFIC dual processor 1213 and a dual communications circuit 1215 and dual on-die memory 1217 such as SRAM. In an embodiment, the dual communications circuit 1215 is particularly configured for RF processing.

In an embodiment, at least one passive device 1280 is coupled to the subsequent integrated circuit 1211 such that the integrated circuit 1211 and the at least one passive device are part of the any apparatus embodiment that includes a TSV RFIC mated to a PAA substrate with cavities that includes the integrated circuit 1210 and the integrated circuit 1211.

In an embodiment, the electronic system 1200 includes an antenna element 1282 such as any PAA embodiment set forth in this disclosure. By use of the antenna element 1282 such as any PAA embodiment set forth in this disclosure, a remote device 1284 such as a television, may be operated remotely through a wireless link by an apparatus embodiment. For example, an application on a smart telephone that operates through a TSV RFIC and PAA substrate with cavities broadcasts instructions through a wireless link to a television up to about 30 meters distant such as by Bluetooth® technology.

In an embodiment, the electronic system 1200 also includes an external memory 1240 that in turn may include one or more memory elements suitable to the particular application, such as a main memory 1242 in the form of RAM, one or more hard drives 1244, and/or one or more drives that handle removable media 1246, such as diskettes, compact disks (CDs), digital variable disks (DVDs), flash memory drives, and other removable media known in the art. In an embodiment, the external memory 1240 is stacked as a TSV chip between a mounting substrate and a PAA substrate with cavities according to any disclosed embodiments. In an embodiment, the external memory 1240 is embedded memory 1248 such an apparatus that includes a TSV RFIC mated to a PAA substrate with cavities according to any disclosed embodiment.

In an embodiment, the electronic system 1200 also includes a display device 1250, and an audio output 1260. In an embodiment, the electronic system 1200 includes an input device such as a controller 1270 that may be a keyboard, mouse, touch pad, keypad, trackball, game controller, microphone, voice-recognition device, or any other input device that inputs information into the electronic system 1200. In an embodiment, an input device 1270 includes a camera. In an embodiment, an input device 1270 includes a digital sound recorder. In an embodiment, an input device 1270 includes a camera and a digital sound recorder.

A foundation substrate 1290 may be part of the computing system 1200. In an embodiment, the foundation substrate 1290 is a motherboard that supports an apparatus that includes a TSV RFIC mated to a PAA substrate with cavities. It may be understood that a secondary low-cost package may be part of the computer system 1200 as well as a motherboard onto which the secondary low-cost package is assembled. In an embodiment, the foundation substrate 1290 is a board which supports an apparatus that includes a TSV RFIC mated to a PAA substrate with cavities. In an embodiment, the foundation substrate 1290 incorporates at least one of the functionalities encompassed within the dashed line 1290 and is a substrate such as the user shell of a wireless communicator.

As shown herein, the integrated circuit 1210 can be implemented in a number of different embodiments, an apparatus that includes a TSV RFIC mated to a PAA substrate with cavities according to any of the several disclosed embodiments and their equivalents, an electronic system, a computer system, one or more methods of fabricating an integrated circuit, and one or more methods of fabricating and assembling an apparatus that includes a TSV RFIC mated to a PAA substrate with cavities according to any of the several disclosed embodiments as set forth herein in the various embodiments and their art-recognized equivalents. The elements, materials, geometries, dimensions, and sequence of operations can all be varied to suit particular I/O coupling requirements including a semiconductive substrate that is metalized with at least one self-formed, self-aligned barrier embodiments and their equivalents.

Although a die may refer to a processor chip, an RF chip, an RFIC chip, IPD chip, or a memory chip may be mentioned in the same sentence, but it should not be construed that they are equivalent structures. Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Terms such as "upper" and "lower" "above" and "below" may be understood by reference to the illustrated X-Z coordinates, and terms such as "adjacent" may be understood by reference to X-Y coordinates or to non-Z coordinates.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A phased-array antenna (PAA) substrate, comprising:
a first dielectric layer containing a plurality of emitter traces;
a second dielectric layer mated to the first dielectric layer, wherein the second dielectric layer is a glass and supports an array of planar antenna elements disposed on a top surface thereof, and wherein the second dielectric layer includes an array of cavities that corresponds to the array of planar antenna elements, wherein each antenna element is vertically aligned with a corresponding cavity in the second dielectric layer.

2. The PAA substrate of claim 1, wherein the first dielectric layer has a higher dielectric constant than the second dielectric layer.

3. The PAA substrate of claim 1, wherein each planar antenna element has an area, and wherein each corresponding cavity has a footprint that is smaller than each corresponding planar antenna element area.

4. The PAA substrate of claim 1, wherein each planar antenna element has an area, and wherein each corresponding cavity has a footprint that is equal to each corresponding planar antenna element area.

5. The PAA substrate of claim 1, wherein each planar antenna element has an area, and wherein each corresponding cavity has a footprint that is larger than each corresponding antenna element area.

6. The PAA substrate of claim 1, wherein each planar antenna element is covered on a bottom surface thereof with the second dielectric layer.

7. The PAA substrate of claim 1, wherein each planar antenna element is exposed on a bottom surface thereof by a corresponding cavity.

8. The PAA substrate of claim 1, wherein each planar antenna element is disposed within a corresponding cavity and covered on a top surface thereof with the second dielectric layer.

9. An apparatus, comprising:
a die including a through-silicon via and a radio frequency integrated circuit (TSV RFIC die); and
a phased-array antenna (PAA) substrate vertically integrated with the TSV RFIC, wherein the PAA substrate includes a plurality of antenna elements, each of which is coupled to the TSV RFIC through a plurality of TSVs, and each of which is disposed above a cavity.

10. The apparatus of claim 9, wherein each antenna element has an area, and wherein the cavities have a footprint that is smaller than the antenna element area.

11. The apparatus of claim 9, wherein each antenna element has an area, and wherein the cavities have a footprint that is equal to the antenna element area.

12. The apparatus of claim 9, wherein each antenna element has an area, and wherein the cavities each have a footprint that is larger than the antenna element area.

13. The apparatus of claim 9, wherein the PAA substrate includes a first dielectric that supports at least one trace, wherein the PAA substrate also includes a glass second dielectric that supports the antenna elements, and wherein the cavities are disposed in the second dielectric.

14. The apparatus of claim 9, wherein the PAA substrate includes a first dielectric that supports at least one trace, wherein the PAA substrate also includes a glass second dielectric that supports the antenna elements, wherein the cavities are disposed in the second dielectric, and wherein each antenna element is covered on a surface with the second dielectric.

15. The apparatus of claim 9, wherein the PAA substrate includes a first dielectric that supports at least one trace, wherein the PAA substrate also includes a glass second dielectric that supports the antenna elements, wherein the cavities are disposed in the second dielectric, and, wherein each antenna element is exposed to a corresponding of the cavities.

16. The apparatus of claim 9, wherein the PAA substrate includes a first dielectric that supports at least one trace, wherein the PAA substrate also includes a glass second dielectric that supports the antenna elements, wherein the cavities are disposed in the second dielectric, and, wherein each antenna element is disposed inside a corresponding of the cavities.

17. The apparatus of claim 9, further including an emitter trace disposed at the first dielectric for each antenna element, wherein the first dielectric is positioned between each emitter trace and a corresponding cavity in the second dielectric.

18. The apparatus of claim 9, further including an emitter trace disposed at the first dielectric for each antenna element, wherein the first dielectric is positioned between each emitter trace and a corresponding cavity in the second dielectric, and wherein each emitter trace is coupled to a corresponding antenna element with a via contact.

19. The apparatus of claim 9, further including a first-level interconnect substrate onto which the TSV RFIC is mounted.

20. The apparatus of claim 9, further including a first-level interconnect substrate onto which the TSV RFIC is mounted, and wherein the first-level interconnect substrate includes at least one passive device embedded therein that functions with the TSV RFIC.

21. The apparatus of claim 9, further including:
   a first-level interconnect substrate onto which the TSV RFIC is mounted, wherein the TSV RFIC includes an active surface and a backside surface;
   a plurality of electrical bumps disposed between the active surface and the first-level interconnect substrate, wherein the first-level interconnect substrate is a direct chip-attach (DCA) substrate; and
   a plurality of backside bumps disposed between the backside surface and the PAA substrate.

22. The apparatus of claim 9, wherein the plurality of antenna elements in the PAA substrate is coupled to the TSV RFIC through inductive-coupling apertures in the PAA substrate.

23. The apparatus of claim 9, wherein the plurality of antenna elements in the PAA substrate is coupled to the TSV RFIC through via-coupling in the PAA substrate.

24. The apparatus of claim 9, further including:
   a first-level interconnect substrate onto which the TSV RFIC is mounted, wherein the PAA substrate includes an embedded ground plane coupled to the plurality of antenna elements and also coupled to the TSV RFIC; and
   at least one dummy bump disposed between the PAA substrate and the substrate onto which the TSV RFIC is mounted.

25. The apparatus of claim 9, further including:
   a through-silicon via digital processor die (TSV DP) coupled to the TSV RFIC through at least one TSV in the TSV RFIC and at least one TSV in the TSV DP, and wherein the TSV DP and the TSV RFIC are vertically integrated below the PAA substrate;
   a first-level interconnect substrate onto which the TSV DP is mounted, wherein the PAA substrate includes an embedded ground plane coupled to the plurality of antenna elements and also coupled to the TSV RFIC; and
   at least one dummy bump disposed between the PAA substrate and the substrate onto which the TSV RFIC is mounted.

26. The apparatus of claim 9, further including:
   a through-silicon via memory die coupled to the TSV RFIC through at least one TSV in the TSV RFIC and at least one TSV in the TSV memory die, and wherein the TSV memory die and the TSV RFIC are vertically integrated below the PAA substrate; and
   a first-level interconnect substrate onto which the TSV memory die is mounted, and wherein the first-level interconnect substrate includes at least one passive device embedded therein that functions with the TSV RFIC.

* * * * *